United States Patent [19]

Halls et al.

[11] Patent Number: 5,670,791
[45] Date of Patent: Sep. 23, 1997

[54] PHOTORESPONSIVE DEVICE WITH A PHOTORESPONSIVE ZONE COMPRISING A POLYMER BLEND

[75] Inventors: Jonathan J. M. Halls; Richard H. Friend, both of Cambridge, England

[73] Assignee: U.S. Philips Corporation, New York, N.Y.

[21] Appl. No.: 561,962

[22] Filed: Nov. 22, 1995

[30] Foreign Application Priority Data

Nov. 23, 1994 [GB] United Kingdom ............... 9423692

[51] Int. Cl.$^6$ ......................................... H01L 35/24
[52] U.S. Cl. .......................... 257/40; 257/184; 257/461
[58] Field of Search ................... 257/40, 184, 461, 257/431; 136/263

[56] References Cited

U.S. PATENT DOCUMENTS 5,247,190  9/1993  Friend et al. ........................... 257/40
5,350,459  9/1994  Suzuki et al. .......................... 136/263

OTHER PUBLICATIONS

"Efficient Photodiodes from Interpenetrating Polymer Networks" J.J.M. Halls et al, Nature, vol. 376, Aug., 1995, pp. 498–500.
"Polymer Leds" R. Friend et al, Physics World, Nov. 1992, pp. 42–46.
"The Photovoltaic Response in Poly(P–Phenylene Vinylene) Thin–Film Devices", R.N. Marks et al, J. Phys. Condensed Matter 6, (1994), pp. 1379–1394.
"Semiconducting Polymer–Buchminsterfullerene Heterojunctions: Diodes, Photodiodes, and Photovoltaic Cells" N. Sariciftci et al, Applied Physics Letters 62 (6), Feb. 1993, pp. 585–587.
"The Physics of Structurally Disordered Matter: An Introduction" Chapter 9, Percolation and Localisation, N.E. Cusack, Iop Publishing Ltd.1987.
"Chemical Tuning of Electroluminescent Copolymers to Improve Emission Efficiencies and Allow Patterning" P.L. Burn et al, Nature, vol. 356, pp. 47–49, 1992.

Primary Examiner—Minh-Loan Tran
Attorney, Agent, or Firm—Ernestine C. Bartlett

[57] ABSTRACT

First and second electrodes (3 and 4) are provided on respective ones (2' and 2") of the first and second major surfaces of a photoresponsive zone (2). The photoresponsive zone (2) is in the form of a polymer blend having regions (2a) of a first semiconductive polymer and regions (2b) of a second semiconductive polymer phase-separated from the first semiconductive polymer. The second semiconductive polymer has an electron affinity greater than that of the first semiconductive polymer so that, in use of the device (1), a photocurrent between the first and second electrodes (3 and 4) resulting from light incident on the photoresponsive layer comprises electrons travelling predominantly through the second semiconductive polymer and holes travelling predominantly through the first semiconductive polymer.

62 Claims, 5 Drawing Sheets

PHOTORESPONSIVE DEVICE WITH A PHOTORESPONSIVE ZONE COMPRISING A POLYMER BLEND

FIELD OF THE INVENTION

This invention relates to photoresponsive devices, in particular photoresponsive devices utilizing semiconductive polymers.

BACKGROUND OF THE INVENTION

As explained in an article published in by R. Friend, D. Bradley and A. Holmes, *Physics World*, November 1992, pp 42 to conjugated polymers are formed if the repeat unit used to construct the polymer chain is made up of atoms with $sp_2$ and $\pi$ covalent bonds resulting in alternating double and single bonds along the polymer chain. The overlap of the $P_z$ orbitals on adjacent sites within the molecule results in the formation of well delocalized $\pi$ valence and $\pi^*$ conduction bands which can support electrons, holes and excited states such as excitons, polarons and bipolarons. Also, the $\sigma$ bonds formed from the $sp_2$ hybrids provide strong bonds that hold the molecule intact, irrespective of the presence of excitations within the $\pi$ and $\pi^*$ bands. Furthermore, the overlap of the $\pi$ orbital on adjacent molecules allows for three dimensional charge transport. These characteristics of conjugated polymers enable them to exhibit semiconductive (sometimes even near metallic) and photoresponsive (either light emitting or light detecting) properties.

The photosensitivity of one particular conjugated polymer, PPV, (poly(p-phenylenevinylene)) is discussed in a paper entitled "The photovoltaic response in poly (p-phenylenevinylene) thin film devices" by R. N. Marks et al, *Journal of Physics*, Condensed Matter, 6 (1994), 1379–1394. In this paper, a thin film of the conjugated polymer PPV is sandwiched between electrodes of differing work functions, one of which is transparent and is generally, though not exclusively, indium tin oxide coated glass. Under short-circuit conditions, the conduction and valence bands formed from the lowest unoccupied and highest occupied molecular orbitals, respectively are bent and an internal electric field is created within the polymer. Photoexcitation in a conjugated polymer does not directly give rise to free carriers, but results in a localized rearrangement of the electron distribution on the polymer chain. This excited state or region is for simplicity herein termed a polaron but may exist in various different charge states, the primary photoexcitation polaron being the singlet exciton which has energy levels within the band gap of the polymer. The exciton may dissociate by separation into an electron and hole or may decay by other means, including re-emission or quenching at a metal contact. The dissociation energy may be provided thermally or by the internal electric fields and is estimated in the afore-mentioned paper to be about 0.4 electron volts (eV) in PPV. The orientation of the internal electric field is such that electrons migrate to and are collected at the contact with the lowest work function, generally an aluminum, magnesium or calcium electrode while holes move towards the electrode with the higher work function, in this case the indium tin oxide electrode. Thus, a photocurrent can be detected and may be used, for example, to provide electrical power as in the case of a solar cell, for example, or to enable detection of part of a light pattern such as an image for use in an image sensor.

So far, under short-circuit conditions quantum yields of the order of about 1% have been measured in such thin film PPV devices at their peak response energy. However, the response of such devices at high photon energies is primarily limited by the low electron mobility of the material because, at high photon energies, most of the incident light is absorbed close to the indium tin oxide electrode and the electrons therefore have to traverse the polymer layer to be collected. As a result of this, the electrons are at a greater risk of being trapped or recombining with holes. Accordingly, the photocurrent spectral response of such devices is redshifted from the absorption of the semiconductive polymer.

The quantum yield in such devices may be improved by increasing the probability of exciton decay into separate charges. This may be achieved by increasing the magnitude of the internal field by decreasing the thickness of the polymer layer. Although this also has the advantage of reducing the possibility of recombination and trapping, the amount of incident light which will be absorbed by the polymer layer is, inevitably, decreased. Another possibility for improving the quantum yield is to use a double or multilayer structure of different materials so as to form a heterojunction and to encourage excitons to dissociate at the heterojunction interface between the two materials. Such an approach is reported in a paper entitled "Semiconducting polymer-Buckminster fullerene heterojunctions: Diodes, photodiodes and photovoltaic cells" by N. S. Sariciftci et al, *Applied Physics Letters*, 62 (6), Feb. 8, 1993 at pages 585 to 587. In this paper, the heterojunction diode consists of successive layers of MEH-PPV (poly (2-methoxy, 5-(2'-ethyl) hexyloxy-p-phenylene vinylene)) and $c_{60}$ (Buckminster fullerene) and gold deposited onto an indium tin oxide coated glass substrate. This work demonstrated that charge transfer takes place on a sub picosecond timescale, three orders of magnitude faster than radiative or non-radiative exciton decay processes. This paper indicates, however, that the effective area of the heterojunction interface needs to be greatly increased to result in efficient photoelectric conversion and proposes the roughening of the substrate to facilitate this.

SUMMARY OF THE INVENTION

It is an aim of the present invention to provide a photoresponsive device comprising semiconductive polymers which enables a greatly improved quantum yield and thus a more efficient energy conversion than has previously been achieved.

According to the present invention, there is provided a photoresponsive device comprising a photoresponsive zone having first and second major surfaces and first and second electrodes provided on respective ones of the first and second major surfaces of the photoresponsive zone, the photoresponsive zone comprising a polymer blend having regions of a first semiconductive polymer and regions of a second semiconductive polymer phase-separated from the first semiconductive polymer, the second semiconductive polymer having an electron affinity greater than that of the first semiconductive polymer so that, in use of the device, a photocurrent between the first and second electrodes resulting from light incident on the photoresponsive layer comprises electrons travelling predominantly through the second semiconductive polymer and holes travelling predominantly through the first semiconductive polymer.

As used herein, the term "semiconductive polymer" means any polymer in which sufficient conjugation is present to enable the percolation threshold for charge conduction to be reached. The term "percolation threshold" should in the present context be understood to mean the fraction of material required to obtain a conductive path through the material. For a further discussion of percolation and percolation thresholds, reference should be made to an appropriate text book, for example the chapter entitled "Percolation and Localization" of "The Physics of Structurally Disordered Matter: an Introduction" by N. E. Cusack published under the Adam Hilger imprint by IOP Publishing Ltd (ISBN 0-85274-591-5). Typically, 25% by volume in three dimensions conjugation should be sufficient. Although substantially the entire polymer chain of the first and second semiconductive polymers could be conjugated, this is not necessary and, for example, conjugated units or sections of the polymer chain may be separated by non-conjugated spacer sections which may be distributed in either a regular or a random way along the polymer chain in a manner similar to that discussed in a paper entitled "Chemical Tuning of Electroluminescent Copolymers to Improve Emission Efficiencies and Allow Patterning" by P. L. Burn, A. B. Holmes, A. Kraft, D. D. C. Bradley, A. R. Brown, R. H. Friend and R. W. Gymer *Nature*, Volume 356, pages 47 to 49, 1992. Another possibility would be to provide the conjugated sections by attaching conjugated side-chains to a non-conjugated polymer backbone or main chain, as found in, for example, poly(vinyl carbazole) and in many side-chain liquid crystal materials.

In operation of a photosensitive device in accordance with the invention, when light of the appropriate wavelength or range of wavelengths is incident on the device, photoexcited states, generally singlet excitons, are generated which then dissociate with the internal electric field facilitating the separation of the dissociated electrons and holes with the electrons generally being present in the second semiconductive polymer and the holes in the first semiconductive polymer. Such a photoresponsive device may be operated in a photovoltaic mode in which no external bias is applied across the first and second electrodes and the internal electric field generated by the separation of the electrons and holes between the first and second semiconductive polymers results in a photocurrent between the first and second electrodes which can be detected using appropriate means or in a photodetector mode in which an external bias is applied across the first and second electrodes to inhibit production of a current between the first and second electrodes until light incident on the device causes the photogeneration of charge carriers as discussed above.

It is believed that the primary mechanism involved in the operation of a device in accordance with the invention is that of photoexcitation in either the first or second semiconductive polymer. The photoexcitation results in generation of an exciton in that semiconductive polymer, followed by exciton dissociation by charge transfer of an electronic charge (electron or hole, depending upon the particular one of the first and second semiconductive polymers in which the exciton was generated) to the other one of the first and second semiconductive polymers. The internal electric field generated within the photoresponsive zone results in electrons being driven towards one of the first and second electrodes and holes towards the other with electron transport being primarily by way of the second semiconductive polymer and hole transport being primarily by way of the first semiconductive polymer. The resulting photocurrent may be detected by conventional means providing a signal indicative of the incident light.

The use of a phase-separated blend of semiconductive polymers enables charge transfer to occur at sites distributed throughout the bulk of the blend of semiconductive polymers. This enables an improvement in quantum yields and also mitigates the problems of the response at high photon energies being limited by poor electron mobility in certain polymers.

As used herein the term 'light' means electromagnetic radiation in the near infra-red, visible and near ultra-violet regions of the spectrum, although, of course, the particular wavelength or range of wavelengths to which the device is responsive will depend upon the particular polymers used to form the photoresponsive zone.

In contrast to a blend of molecular materials or a blend of a molecular material and a polymer, a blend of polymers is expected, when the entropy of mixing is considered, to separate into different phases. Generally, the blend of the first and second semiconductive polymers will be such that the regions of the first and second semiconductive polymers form respective continuous networks that interpenetrate so that there is a respective continuous path through each of the semiconductive polymers and a charge carrier within one of the first and second semiconductive polymers can travel between the first and second electrodes without having to cross into the other semiconductive polymer. However, this need not necessarily be the case provided that the distance between adjacent portions or regions of the same semiconductive polymer in the phase-separated blend is small enabling a charge carrier to tunnel through, or at least only to have to travel a short distance through, the other semiconductive polymer.

Generally, the first and second semiconductive polymers will each have one or more substituents or side groups. This should facilitate formation of the blend where the blend is formed by dissolving the first and second semiconductive polymers in a suitable solvent because polymers having flexible side groups tend to be more soluble in currently available solvents. Of course, other ways of forming the blend that do not necessarily require the presence of such substituents may be possible. Thus, for example, it may be possible, depending upon the particular polymers being used, to melt the first and second semiconductive polymers at elevated temperature and then mix them together.

Figure 1A:
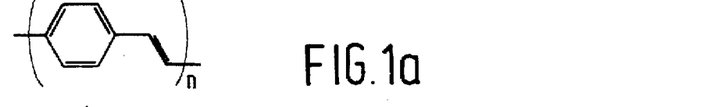
Figure 1B:
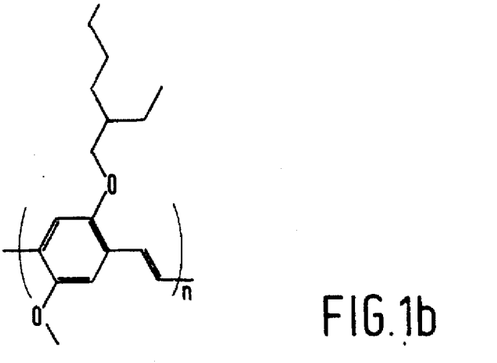
Figure 1C:
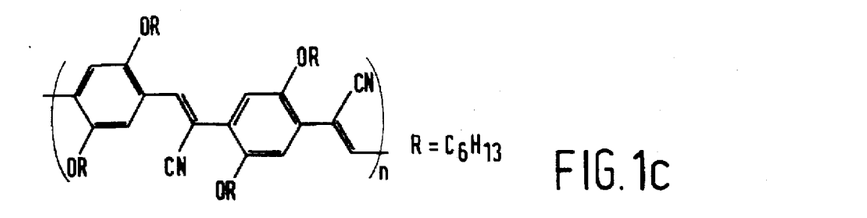

The first and second semiconductive polymers may both be derived from PPV (that is poly (p-phenylene vinylene), the chemical structural formula of which is shown in FIG. 1a of the accompanying drawings. In one example, the first semiconductive polymer comprises MEH-PPV (that is poly (2-methoxy, 5-(2'-ethyl)hexyloxy-p-phenylene vinylene)) having the chemical structural formula shown in FIG. 1b of the accompanying drawings and the second semiconductive polymer comprises a cyano-substituted copolymer of PPV which desirably has one or more alkyl side groups such as hexyloxy ($OC_6H_{13}$) that should improve the solubility of the polymer in, for example, chloroform. For example, the second semiconductive polymer may be CN-PPV, that is a cyano-substituted copolymer of poly (p-phenylenevinylene) having the chemical structural formula shown in FIG. 1c of the accompanying drawings.

Although the above-mentioned first and second semiconductive polymers are preferred examples of polymers to be used for forming the blend, it is possible that other semiconductive polymers may be used. Thus, for example, for the first semiconductive polymer, the phenylene ring of PPV may carry one or more of a number of different substituents or side groups. The actual substituents should be selected according to the electron affinity of the resultant first semiconductive polymer, assessed by, for example, electrochemical techniques and generally should also be selected according to the solubility of the resultant first semiconductive polymer in solvents which are also solvents for the second semiconductive polymer or according to the possibility of forming the blend using a melt process. Possible substituents may be selected from the group consisting of alkyl, alkoxy, thiol, halogen and nitro ($NO_2$) compounds. In these groups preferred possibilities are methyl, methoxy or ethoxy, chlorine or bromine.

Provided that appropriate solvents or melt techniques can be found, then it may be possible to use as the first and second semiconductive polymers at least some of the derivatives of PPV disclosed in U.S. Pat. No. 5,247,190 or derivatives thereof having additional side groups or substituents to improve solubility and, in the case of the second semiconductive polymer, to improve its electron-withdrawing properties, that is its capability to remove electrons from the first semiconductive polymer. As another possibility, the phenylene ring may be replaced with a heterocyclic ring system such as a furan or thiophene ring.

Generally, the second semiconductive polymer is chosen to be cosoluble with the first semiconductive polymer in a suitable solvent, although, as indicated above, there may be other methods of forming the blend without the use of a solvent. Where the second semiconductive polymer is chosen to be cosoluble with the first semiconductive polymer in an appropriate solvent suitable examples may be formed by the attachment of electron-withdrawing substituents or side groups to a polymer chain similar to that of the first semiconductive polymer. The electron-withdrawing side groups may be attached at every repeat unit along the chain or at regular or even random positions on the chain. For example, where the first semiconductive polymer is PPV with one or more substituents, then the second semiconductive polymer may be a copolymer of PPV with at least one substituent. As other possible examples, the second semiconductive polymer may be a copolymer of any of the semiconductive polymers derived from PPV mentioned above. Examples of electron-withdrawing substituents appropriate for the poly(phenylene vinylene) polymers that are soluble by virtue of the presence of alkyl or alkoxy side-chains include —C N (nitrile or cyano groups, for example), trifluoromethyl and ester groups. In these examples, the electron-withdrawing group should be in direct contact with the delocalized $\pi$ electrons on the chain. Other possible second semiconductive polymers may contain thiophene groups in addition to phenylene groups. As another possibility, instead of adding electron-withdrawing substituents to a selected polymer, the polymer itself may have an inherently higher electron affinity than the first semiconductive polymer, for example the second conductive polymer may be a polypyridene or a polyquinoline.

Other possibilities for the first (ie the lower electron affinity) semiconductive polymer are, poly(arylenevinylene) copolymers that contain one or more types of ring (aromatic or heteroaromatic) selected from the examples given above. Besides the PPV type of polymers mentioned above, other possibilities are the poly(phenylene)s with the addition, if necessary to form the blend, of appropriately located substituents or side groups or the poly(thienylenes)s with the addition, if necessary to form the blend, of substituents or side groups at the 3 and 3' positions; for example a poly(3-alkyl thienylene) or a poly(3, 3' alkyl thienylene), with the alkyl group being selected to provide the desired solubility which will generally mean that the alkyl is a butyl or longer carbon chain alkyl group. Similar poly(phenylene) or poly (thienylenes) polymers may be used for the second semiconductive polymer with the addition of suitable electron-withdrawing groups such as nitrile, ester or perfluoroalkyl groups. Other possible polymers for forming the second semiconductive polymer but which would not generally, depending upon the nature of the first semiconductive polymer, require the addition of electron-withdrawing groups include polypyridines, polyquinolenes and polymers containing oxadiazole or oxazole groups.

As another possibility, modified forms of any of the above polymers in which the conjugation along the polymer chain is interrupted at regular or random intervals by non-conjugated spacer units may be used in a manner similar to that discussed in a paper entitled "Chemical Tuning of Electroluminescent Copolymers to Improve Emission Efficiencies and Allow Patterning" by P. L. Burn, A. B. Holmes, A. Kraft, D. D. C . Bradley, A. R. Brown, R. H. Friend and R. W. Gymer *Nature*, Volume 356, pages 47 to 49, (1992). Further, the first and second semiconductive polymers may be formed by providing conjugated units as side groups or substituents on a non-conjugated backbone or main polymer chain such as a polyacrylate. Indeed any polymer in which sufficient conjugation is present to enable the percolation threshold for charge conduction to be reached and which can be blended with another such polymer having a higher electron affinity may be suitable for use in a device in accordance with the present invention. Typically, 25% by volume in three dimensions conjugation should be sufficient.

Of course, these different possibilities for the first and second semiconductive polymers may have different semiconductor energy levels and band gaps and so the actual nature of the particular polymers selected may, of course, affect the wavelength or wavelengths to which the photoresponsive device is responsive.

Generally, the blend will consist simply of the first and second semiconductive polymers. However, the blend may contain other components which may be polymers or molecular materials and which might not play any active role with respect to the photoresponsive characteristics of the blend or might assist in light-harvesting by capturing and transferring excitons to one or other of the first and second semiconductive polymers.

At least one of the first and second electrodes may be light-transmissive, to allow light to be incident on the photoresponsive zone. For example, one of the first and second electrodes may be formed of indium oxide or indium tin oxide. As an alternative possibility, the at least one electrode may be formed with apertures to enable light to be incident on the photoresponsive zone. The other of the first and second electrodes may be formed of any suitable electrically conductive material, generally a metal or metal alloy that is more electronegative than indium tin oxide, for example, aluminum, magnesium or calcium.

The present invention also provides a photoresponsive semiconductor comprising a polymer blend having regions of a first semiconductive polymer and regions of a second semiconductive polymer phase-separated from the first semiconductive polymer and having an electron affinity greater than that of the first semiconductive polymer, so facilitating charge separation between the first and second semiconductive polymers. Such a photoresponsive semiconductor could be used, for example, as the charge separation part of a composite used as a photorefractive material.

BRIEF DESCRIPTION OF THE DRAWINGS

Embodiments of the invention will now be described, by way of example, with reference to the accompanying drawings, in which:

FIGS. 1*a*, 1*b* and 1*c* show, respectively, the, chemical structural formulae of PPV, MEH-PPV and CN-PPV while

FIG. 2 is a schematic cross-sectional view through a photoresponsive device in accordance with the invention;

FIG. 3a illustrates schematically by way of band structure diagrams the generation by photoexcitation of an exciton in MEH-PPV and the transfer to the conduction band of CN-PPV of the electron following dissociation of the exciton while

FIG. 4a is a schematic diagram for illustrating phase segregation or separation of the first and second semiconductive polymers of the photoresponsive zone of a device in accordance with the invention while

It should, of course, be understood that FIGS. 2 to 5b are merely schematic and are not to scale. Like reference numerals are used throughout the description to refer to like components.

DETAILED DESCRIPTION OF THE PREFERRED EMBODIMENTS

Figures 2, 3A:
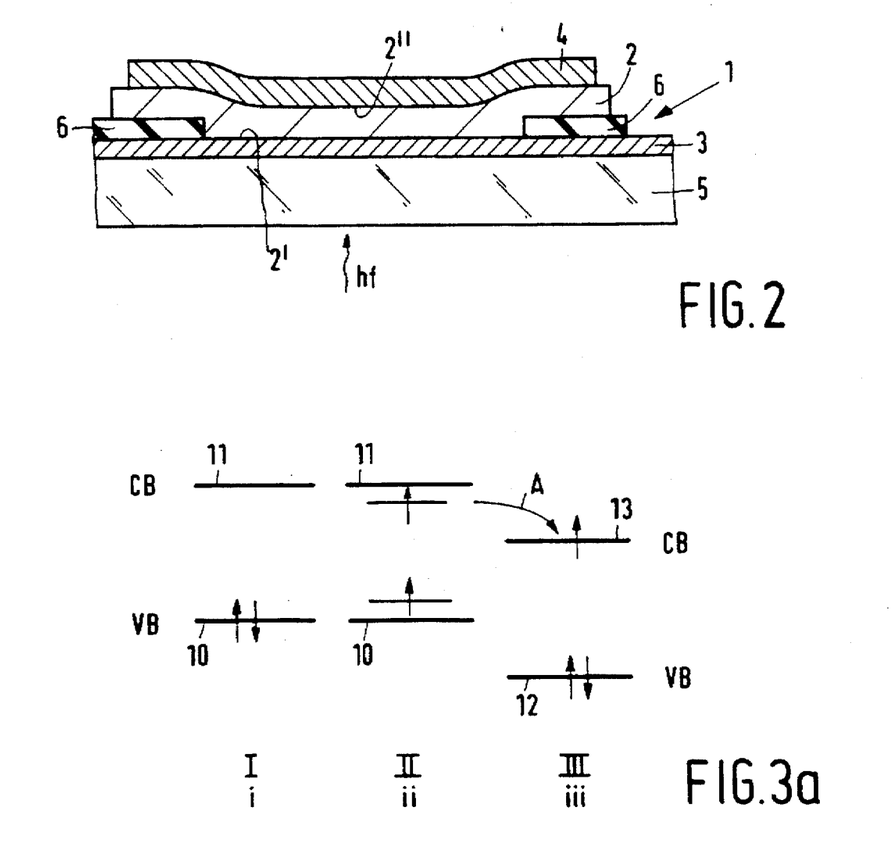
Figure 4A:
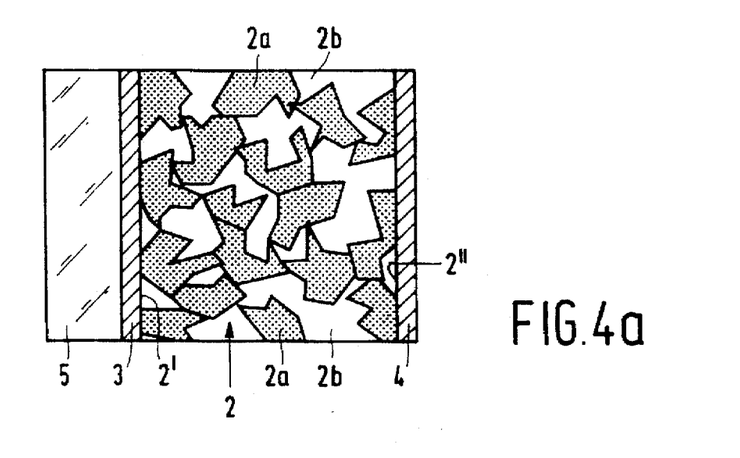

Referring now to the drawings, in particular FIGS. 2 and 4a, there is illustrated a photoresponsive device 1 comprising a photoresponsive zone 2 having first and second major surfaces 2' and 2" and first and second electrodes 3 and 4 provided on respective ones of the first and second major surfaces of the photoresponsive zone 2, the photoresponsive zone 2 comprising a polymer blend having regions 2a of a first semiconductive polymer and regions 2b of a second semiconductive polymer phase-separated from the first semiconductive polymer, the second semiconductive polymer having an electron affinity greater than that of the first semiconductive polymer so that, in use of the device, a photocurrent between the first and second electrodes 3 and 4 resulting from light incident on the photoresponsive layer 2 comprises electrons travelling predominantly through the second semiconductive polymer and holes travelling predominantly through the first semiconductive polymer.

In operation of a photosensitive device 1 in accordance with the invention, when light hf of the appropriate wavelength or range of wavelengths is incident on the device, photoexcited states, generally singlet excitons, are generated which then dissociate with the internal electric field facilitating the separation of the dissociated electrons and holes with the electrons generally being present in the second semiconductive polymer and the holes in the first semiconductive polymer. Such a photoresponsive device may be operated in a photovoltaic mode in which no external bias is applied across the first and second electrodes 3 and 4 and the internal electric field generated by the separation of the electrons and holes between the first and second semiconductive polymers results in a photocurrent between the first and second electrodes 3 and 4 which can be detected using appropriate means or in a photodetector mode in which an external bias is applied across the first and second electrodes 3 and 4 to inhibit production of a current between the first and second electrodes 3 and 4 until light incident on the photoresponsive zone 2 causes the photogeneration of charge carriers as discussed above.

It is believed that the primary mechanism involved in the operation of this device 1 is that of photoexcitation in either the first or second semiconductive polymer which results in generation of an exciton in that semiconductive polymer, followed by exciton dissociation by charge transfer of an electronic charge (electron or hole, depending upon the particular one of the first and second semiconductive polymers in which the exciton was generated) to the other one of the first and second semiconductive polymers. The internal electric field generated within the photoresponsive zone 2 results in electrons being driven towards one of the first and second electrodes 3 and 4 and holes towards the other with electron transport being primarily by way of the second semiconductive polymer and hole transport being primarily by way of the first semiconductive polymer. The resulting photocurrent may be detected by conventional means providing a signal indicative of the incident light.

The use of a phase-separated blend of semiconductive polymers enables charge transfer to occur at sites distributed throughout the bulk of the blend of semiconductive polymers. This enables an improvement in quantum yields and also mitigates the problems of the response at high photon energies being limited by poor electron mobility in certain polymers.

In the example specifically illustrated in FIG. 2, the photoresponsive device 1 comprises an insulative substrate 5 which is, in this example, light transmissive and is formed of a suitable glass or plastics material such as a polymer film, for example a polyester film. The first electrode 3 is formed on the substrate 5 using any suitable technique, for example, evaporation, chemical vapor deposition or sputtering. In this particular case, the first electrode 3 is formed of a light-transmissive electrically conductive material such as indium tin oxide (ITO). Polyester film coated with ITO is available commercially from Courtaulds and other Companies and may be used in the present circumstances. As an alternative to using a light transmissive electrically conductive material, the first electrode 3 may be formed of an opaque electrically conductive material with one or more apertures to allow the transmission of light to the photoresponsive zone 2. Any other suitable high work function electrically conductive material may be used for the first electrode. Thus, materials such as gold, chromium, nickel, platinum could possibly be used and could be kept semi-transparent if made sufficiently thin, although in such circumstances, it may be preferable for this metal layer to be formed on top of another transparent conductive layer such as ITO. Electrically conductive non-metals such as polyaniline could perhaps also be used.

After suitable cleaning of the first electrode 3, for example in an ultrasonic bath with acetone and propan-2-ol, a suitable inorganic insulating barrier layer, for example a silicon monoxide layer, is thermally evaporated onto the first electrode 3 through an appropriate mask to define insulative regions 6 which define the extent of the device 1 and serve to inhibit undesired short-circuits.

In this example, the photoresponsive zone 2 is provided as a layer on the first electrode 3 by dissolving the first and second semiconductive polymers in a suitable solvent, spin-coating the thus-formed solution onto the first electrode 3 and subsequently evaporating off the solvent. The blending is carried out so that the volume fraction of each of the two active semiconductor components, that is the first and second semiconductive polymers, exceeds the percolation threshold for charge carriers (typically 25% volume fraction). Thus, typically, the ratio by volume between the first and second semiconductive polymers will be in the range 1:3 to 3:1, although the range may be somewhat restricted if the blend contains other components. The layer 2 should of course be sufficiently thick to allow a sufficient proportion of the light of the appropriate wavelength incident on the layer to be absorbed. Generally, the layer 2 will be sufficiently thick so as to absorb all the incident light of the appropriate wavelength, but no thicker.

In this particular example both the first and second semiconductive polymers are derived from PPV (that is poly (p-phenylenevinylene), the chemical structural formula of which is shown in FIG. 1a. Thus, the first semiconductive polymer comprises MEH-PPV (that is poly(2-methoxy, 5-(2'-ethyl)hexyloxy-p-phenylene vinylene)) having the chemical structural formulae shown in FIG. 1b and the second semiconductive polymer comprises a cyano-substituted copolymer of PPV which desirably has one or more alkyl side groups such as hexyloxy ($OC_6H_{13}$) that should improve the solubility of the polymer in, for example, chloroform. In this particular example, the second semiconductive polymer is CN-PPV (that is a cyano-substituted copolymer of poly (p-phenylenevinylene)) having the chemical structural formula shown in FIG. 1c. In the case of MEH-PPV and CN-PPV, a suitable solvent is chloroform. In this example, the solutions of MEH-PPV and CN-PPV were such and were mixed in measure volume ratios such that the ratio of MEH-PPV to CN-PPV was approximately 1:1 by weight.

After formation of the polymer blend photoresponsive layer 2 by, for example, spin coating as indicated above, the structure is then annealed in vacuo at a suitable elevated temperature, for example 100° C., for sufficient time, generally several hours, to remove the residual solvent.

The second electrode 4 is then provided without breaking the vacuum using any suitable techniques such as, for example, evaporation, sputtering or chemical vapor deposition (CVD). The second electrode may be formed of any suitable electrically conductive material, generally a metal or metal alloy which is more electronegative than the first electrode, for example, aluminum, calcium or magnesium where the first electrode is formed of ITO. In this example, aluminum is used. In operation of a device in accordance with the invention when a biassing voltage is applied across the first and second electrodes 3 and 4, the device 1 is considered to be forward-biassed when the more electronegative electrode (that is the aluminum electrode in this case) is held negative with respect to the other electrode and reverse-biassed when the more electronegative electrode is held positive with respect to the other electrode. Although in this example the transparent electrode is the bottom electrode 3 and, in use of the device light is incident through the substrate 5, the electrodes could, of course be reversed so that the light-transmissive electrode is on the surface of the layer 2 remote from the substrate 2 and the device is illuminated from the side remote from the substrate 2. In such circumstances, the substrate 2 need not, of course, be light-transmissive.

Although the above-mentioned first and second semiconductive polymers are preferred examples of polymers to be used for forming the blend, it is possible that other semiconductive polymers may be used. Thus, for example, for the first semiconductive polymer, the phenylene ring of PPV may carry one or more different substituents or side groups. The actual substituents should be selected according to the resulting electron affinity of the resultant first semiconductive polymer (which should be lower than that of the second semiconductive polymer), assessed for example, electrochemical techniques, and generally also according to the solubility of the resultant first semiconductive polymer in solvents which are also solvents for the second semiconductive polymer or to the possibility of forming the blend using a melt process. Possible substituents may be selected from the group consisting of alkyl, alkoxy, thiol, halogen and nitro ($NO_2$) compounds. In these groups preferred possibilities are methyl, methoxy or ethoxy, chlorine or bromine.

Figure 1D:
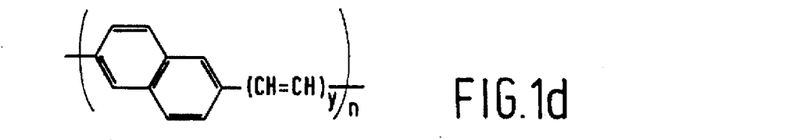
FIGS. 1*d*, 1*e*, 1*f* and 1*g* show the chemical structural formulae of various derivatives of PPV or related monomers; wherein n and y is an integer greater than 1, as is well known in the art.
Figure 1E:
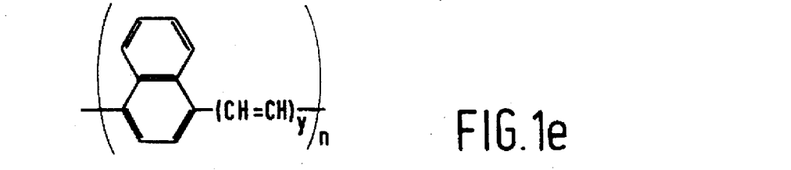
Figure 1F:
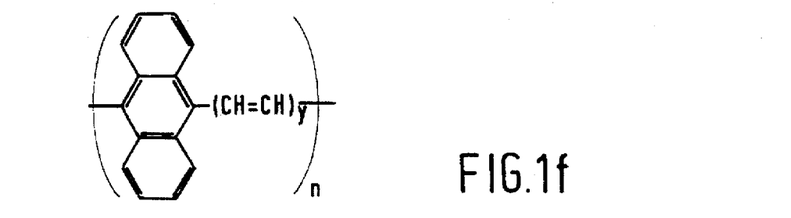
Figure 1G:
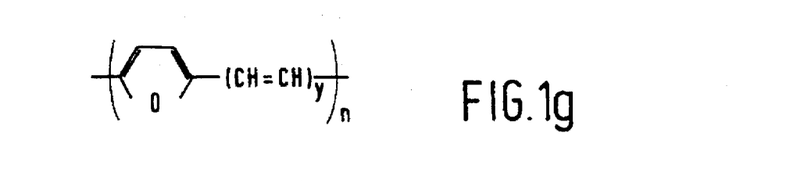

Provided that appropriate solvents or melt techniques can be found, then it may be possible to use as the first and second semiconductive polymers at least some of the semiconductive polymers disclosed in U.S. Pat. No. 5,247,190, or derivatives thereof having additional side groups or substituents to improve solubility and, in the case of the second semiconductive polymer, to improve its electron-withdrawing properties, that is, its capability to remove electrons from the first semiconductive polymer. Some possible examples of derivatives of PPV thus are polymers wherein the phenylene ring in FIG. 1a is replaced with a fused ring system, for example by replacing the phenylene ring with an anthracene or naphthalene ring system to give structures such as those shown in FIGS. 1d, 1e and 1f. As another possibility, the phenylene ring may be replaced with a heterocyclic ring system such as a furan or thiophene ring to give a chemical formula for the polymer of the type shown in FIG. 1g.

Generally, the second semiconductive polymer is chosen to be cosoluble with the first semiconductive polymer in a suitable solvent. There may, of course, be other methods of forming the blend without the use of a solvent. Thus, for example, if the particular polymers being used, are cosoluble at elevated temperatures, then the blend could be formed by melting the two polymers. Where the second semiconductive polymer is chosen to be cosoluble with the first semiconductive polymer in an appropriate solvent suitable examples may be formed by the attachment of electron-withdrawing substituents or side groups to a polymer chain similar to that of the first semiconductive polymer at every repeat unit along the chain or at regular or even random positions on the chain. For example, where the first semiconductive polymer is PPV with one or more substituents, the second semiconductive polymer may be a copolymer of PPV with at least one substituent. As other possible examples, the second semiconductive polymer may be a copolymer of any of the semiconductive polymers derived from PPV mentioned above. Examples of electron-withdrawing substituents appropriate for the poly(phenylene vinylene) polymers that are soluble in, for example, chloroform by virtue of the presence of alkyl or alkoxy side-chains include —C N (nitrile or cyano groups, for example), trifluoromethyl and ester groups. In these examples, the electron-withdrawing group should be in direct contact with the delocalized π electrons on the chain. Other possible second semiconductive polymers may contain thiophene groups in addition to phenylene groups.

Other possibilities for the first (that is, the lower electron affinity) semiconductive polymer are poly(arylenevinylene) copolymers which contain one or more types of ring (aromatic or heteroaromatic) selected from the examples given above. Besides the PPV type of polymers mentioned above, other possibilities are the poly(phenylene)s with the addition, if necessary to form the blend, of appropriately located substituents or side groups or the poly(thienylenes)s with the addition, if necessary to form the blend, of substituents or side groups at the 3 and 3' positions for example a poly(3-alkyl thienylene) or a poly(3, 3' alkyl thienylene), with the alkyl group being selected to provide the desired solubility which will generally mean that the alkyl is a butyl or longer carbon chain alkyl group. Similar poly(phenylene) or poly(thienylenes) polymers may be used for the second semiconductive polymer with the addition of suitable electron-withdrawing groups such as nitrile, ester or perfluoroalkyl groups. Other possible polymers for forming the second semiconductive polymer but which would not generally, depending upon the nature of the first semiconductive polymer of course, require the addition of electron-withdrawing groups include polypyridines, polyquinolenes and polymers containing oxadiazole or oxazole groups.

In addition to the above, modified forms of any of the above polymers in which the conjugation along the polymer chain is interrupted at regular or random intervals by non-conjugated spacer units may be used in a manner similar to that discussed in a paper entitled "Chemical Tuning of Electroluminescent Copolymers to Improve Emission Efficiencies and Allow Patterning" by P. L. Burn, A. B. Holmes, A. Kraft, D. D. C. Bradley, A. R. Brown, R. H. Friend and R. W. Gymer *Nature*, Volume 356, pages 47 to 49, 1992. Further, the first and second semiconductive polymers may be formed by providing conjugated units as side groups or substituents on a non-conjugated backbone or main polymer chain such as a polyacrylate. Indeed any two polymers in which sufficient conjugation is present to enable the percolation threshold for charge conduction to be reached, which have different electron affinities and which can be mixed using an appropriate technique may be used to form the polymer blend. Typically, 25% by volume in three dimensions conjugation should be sufficient.

Of course, the actual properties of the layer 2 will depend upon the particular first and second semiconductive polymers used. In particular, the band gap of the first and second semiconductive polymer and thus the sensitivity of the device to different wavelengths of light will, of course, depend upon the precise chemical structure of the polymers.

Generally, the blend will consist simply of the first and second semiconductive polymers. However, the blend may contain other components which may be polymers or molecular materials and which might not play any active role with respect to the photoresponsive characteristics of the blend or might assist in light-harvesting by capturing and transferring excitons to one or other of the first and second semiconductive polymers.

The operation of a device 1 in accordance with the invention having the structure shown in FIG. 2 and a photoresponsive layer 2 formed from a blend of MEH-PPV and CN-PPV when light of the appropriate wavelength is incident on the device will now be explained with the help of FIGS. 3a, 3b, 4a and 4b.

FIG. 3a shows diagrammatically the conduction and valence band structures of MEH-PPV and CN-PPV. The diagram i of FIG. 3a shows the highest occupied valence band VB level 10 and lowest unoccupied conduction band CB level 11 in the ground state of MEH-PPV, these levels having energies that have been estimated at 4.9 eV and 2.8 eV, respectively.

As indicated above, in semiconductive polymers, charge carriers are not free but photoexcitation causes a local rearrangement of the chain with π and π* states being pulled away from the band edges into the band gap to form exciton states (excitons, polarons and/or bipolarons). Neutral singlet excitons are the primary result of photoexcitation and are effectively neutral electron-hole correlated states.

The center diagram ii in FIG. 3a illustrates diagrammatically a photoexcited state within MEH-PPV where photoexcitation by incident light has caused the formation of a neutral singlet exciton.

The exciton may decay by radiative or non-radiative means, may dissociate into free carriers or may be quenched at a metal contact by the image charge effect. The right hand diagram iii of FIG. 3a illustrates the highest valence band level VB 12 of the second semiconductive polymer CN-PPV and the lowest conduction band level CB 13 of CN-PPV. The highest valence band level 12 of CN-PPV has an energy estimated at 5.7 eV while the lowest conduction band CB level 13 has an energy estimated at 3.6 eV. It is therefore energetically favorable for an electron resulting from dissociation of an exciton to transfer from the conduction band level 11 of the first semiconductive polymer MEH-PPV to the conduction band level 13 of the second semiconductive polymer CN-PPV as indicated by the arrow A in FIG. 3a while it is energetically favorable for the hole resulting from the dissociation of the exciton to remain in the valance band 10 of the first semiconductive polymer MEH-PPV. Thus CN-PPV has a higher electron affinity than MEH-PPV.

Figure 3B:
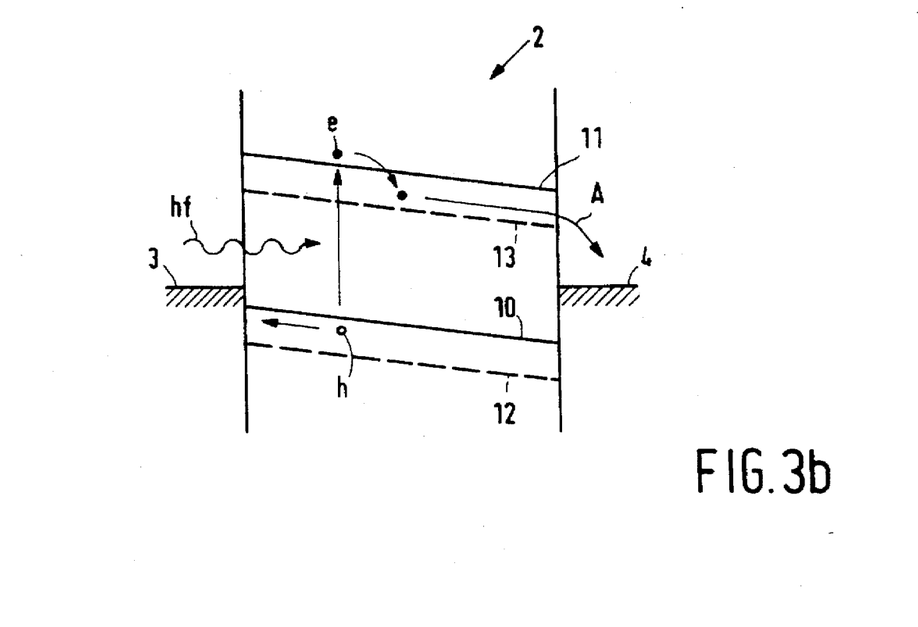
FIG. 3b is a schematic band structure diagram for a device in accordance with the invention for illustrating the mechanism by which a photocurrent is generated in response to incident light.

FIG. 3b illustrates very diagrammatically the energy band levels within a device in accordance with the invention with the solid lines representing the highest occupied valence band VB 10 and lowest unoccupied conduction band CB 11 of the first semiconductive polymer, MEH-PPV in this case, and the dashed lines representing the highest occupied valence band VB 12 and lowest unoccupied conduction band CB 13 of the second semiconductive polymer, CN-PPV in this case.

FIG. 4a is a very schematic and diagrammatic representation of a device 1 in accordance with the invention which illustrates in an extremely simplified manner the structure within the photoresponsive layer 2. In contrast to a blend of molecular materials or a blend of a molecular material and a polymer, a blend of polymers is expected, when the entropy of mixing is considered, to separate into different phases. Accordingly, as indicated above, the photoresponsive layer 2 comprises a phase-separated blend of the first and second semiconductive polymers formed so that the volume fraction of each of the first and second semiconductive polymers exceeds the percolation threshold, typically 25% volume fraction, and so will have, as indicated diagrammatically in FIG. 4a, first regions or domains 2a of the first semiconductive polymer and second regions or domains 2b of the second semiconductive polymer. Generally the blending will be such that the first domains 2a are joined together to form a first three dimensional continuous network or matrix of the first semiconductive polymer and the second domains 2b are joined together to form a second three dimensional continuous network or matrix with the two networks passing through one another or interpenetrating. The continuous nature of the two networks is not, of course, evident from FIG. 4a because FIG. 4a is simply a cross-sectional view in two dimensions.

The first domains 2a and the second domains 2b need not necessarily form completely continuous respective first and second networks. However, the blend should be such that the shortest path between adjacent domains 2a or 2b of the same semiconductive polymer is sufficiently small to enable charge carriers to cross without difficulty, preferably to be able to tunnel through, an intervening domain 2b or 2a of the other semiconductive polymer.

Figure 4B:
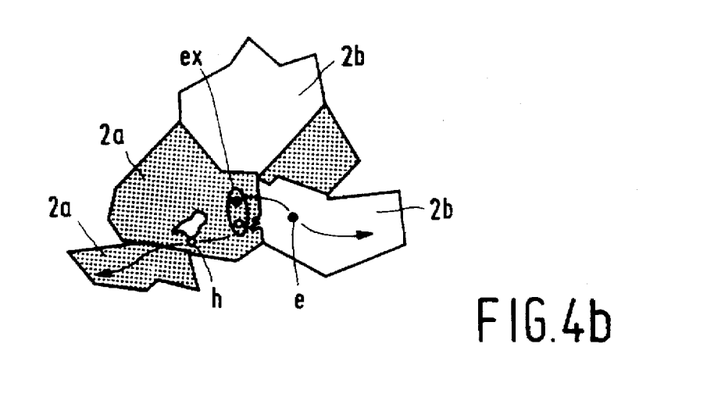
FIG. 4b shows part of FIG. 4a enlarged.

FIG. 4b is an enlarged view of part of FIG. 4a showing the photogeneration, as a result of incident light hf, of an exciton ex within a first domain 2a of the first semiconductive polymer, in this case MEH-PPV.

Following dissociation of the exciton ex, the dissociated electron e transfers to the adjacent second domain 2b of the higher electron affinity second semiconductive polymer while the dissociated hole h remains in the first semiconductive polymer. Under the influence of the internal electric field generated within the layer 2, the electron e moves (as indicated by the arrow in FIG. 4b) through the second domains 2b, tunnelling or hopping through any first domains 2a if there is a discontinuity in the first network formed by the second domains 2b, towards the more positive one of the first and second electrodes 3 and 4 while the hole h travels, as indicated by the arrow in FIG. 4b, through the first domains 2a, hopping or tunnelling through any intervening second domain 2b if there is a discontinuity in the second network, towards the more negative of the first and second electrodes 3 and 4.

Thus, as shown diagrammatically in FIG. 3b, light hf incident on the photoresponsive layer 2 results in the formation of excitons within the first semiconductive polymer, MEH-PPV in this case, these excitons then dissociate with the holes h travelling under the influence of the internal electric field predominantly or primarily through the first semiconductive polymer toward the first electrode 3. As indicated above, it is energetically favorable for the electrons e to transfer to the conduction band level 13 of the second semiconductive polymer, in this case CN-PPV. The transferred electrons e then travel under the influence of the internal electric field towards the second electrode 4 predominantly through the second semiconductive polymer domains 2b.

Incident light hf of the appropriate wavelength or wavelengths thus results in a photocurrent which may be used for any suitable purpose. As indicated above, the device may be used in a photovoltaic mode with no external bias applied across the first and second electrodes 3 and 4 simply to enable the generation of electrical energy from incident light as in the case of, for example, a solar cell. As another possibility, the device may be operated in a photodetector mode in which an external reverse bias is applied across the first and second electrodes 3 and 4 (that is the more electronegative electrode is held positive with respect to the other electrode, that is the ITO electrode 3 in the example described above is biassed negative with respect to the aluminum electrode 4) to inhibit production of a current between the first and second electrodes until light incident on the device causes the photogeneration of charge carriers. Thus, for example, it may be possible to provide an array of one or more rows of devices having the structure shown in FIG. 1 to enable the detection of an image incident on the array by detecting light transmitted through or reflected from a particular part of the image, for example a document or the like. Thus, a photoresponsive device in accordance with the invention may be used in any circumstance where a conventional photoresponsive device such as an amorphous silicon photodiode may be used, for example to replace the amorphous silicon diodes in a two-dimensional matrix-addressed array such as those disclosed in U.S. Pat No. 5,276,329 and U.S. Pat. No. 5,315,101, for example.

The results of experiments carried out on photoresponsive devices manufactured as described above with reference to FIG. 1 will now be described with the help of FIG. 5 which shows schematically apparatus 20 used for carrying out the measurements.

Figure 5:
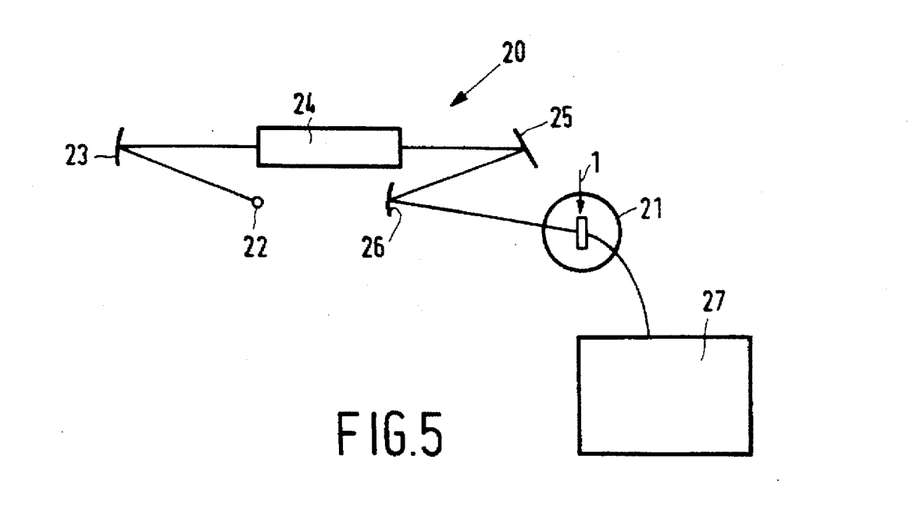
FIG. 5 is a schematic diagram of apparatus used to carry out measurements on a photoresponsive device of the type shown in FIG. 2.

As shown in FIG. 5, the device 1 was mounted in a continuous flow cryostat 21 provided with optical windows (not shown). Measurements of the spectral response of the device 1 were made by illuminating the diode from the side of the first electrode 3 with light from a tungsten lamp 22 focused by a reflector 23 into a suitable monochromator 24, for example a Chromex 250/500 monochromator manufactured by Chromex of the United States of America from which the monochromatic light is reflected and then focused by respective reflectors 25 and 26 onto the optical window of the cryostat 21. The intensity of the light incident on the device was controlled by the insertion of neutral density filters. The electrical output of the device 1 was measured using suitable detection equipment 27 as will be described below with reference to the various experiments.

Figure 6:
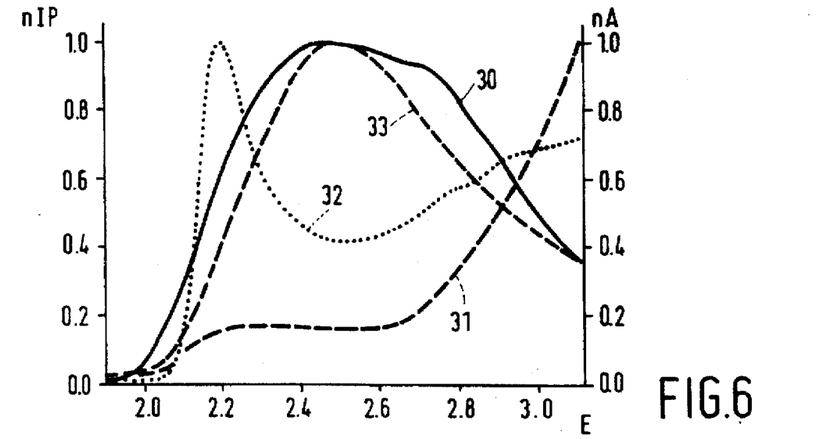
FIG. 6 is a graph of normalized short-circuit photocurrent nIP or normalized absorbance nA against energy E in electron volts (eV) for various different photoresponsive devices having polymer photoresponsive zones.

FIG. 6 illustrates the normalized short-circuit photocurrent nIP (that is the photocurrent measured with the first and second electrodes held at the same potential but with the circuit set up to measure the current flowing between the electrodes with a suitable ammeter) measured as a function of the energy E in electron-volts (eV) of the incident light for a device 1 in accordance with the invention having a MEH-PPV/CN-PPV polymer blend photoresponsive layer 2 with a thickness of 175 nanometers (nm) and for devices in which the blend layer 2 is replaced by a layer of a single polymer, in one case a layer of MEH-PPV with a thickness of 200 nm and in the other case a layer of CN-PPV with a thickness of 110 nm. The photocurrent was measured using a suitable electrometer as the measuring unit 27, for example a Keithley 617 electrometer manufactured by Keithley of the United States of America.

The measured photocurrents were corrected for the response of the lamp 22 and monochromator 24 and normalized to give a peak height of unity as shown in FIG. 6. The solid line 30 illustrates the spectral response of a device 1 in accordance with the invention while the dashed line 31 illustrates the spectral response of a device having a photoresponsive layer formed only of CN-PPV and the dotted line 32 illustrates the spectral response of a device having a photoresponsive layer formed only of MEH-PPV. The large dashed line 33 shows the normalized absorbance nA of a device 1 in accordance with the invention.

As can be seen from FIG. 6, the dashed line 31 representing the device having a photoresponsive layer formed only of the polymer CN-PPV shows the photocurrent nIP commencing at the optical band gap (about 2.1 eV), and peaking outside the energy range shown in FIG. 6. The spectral response of the diode having a photoresponsive layer formed only of MEH-PPV is, as shown by the dotted line 32, similar to that of PPV showing a steep increase in photocurrent at the onset of the optical gap, peaking at about 2.2 eV.

The spectral response of the device in accordance with the invention as illustrated by the solid line 30 also shows the onset of a photocurrent at about the optical band gap, peaks at just over 2.4 eV and then gradually tails off at higher energies. As can be seen from FIG. 6, the spectral response 30 of the device in accordance with the invention very nearly follows the absorbance curve 33 for the blend which is similar to those of the separate polymers (not shown). In contrast to the strong energy response of the CN-PPV photoresponsive layer device, neither the MEH-PPV photoresponsive layer device nor the device in accordance with the invention show any significant signal at about 3.0 eV. Thus, as can be seen from FIG. 6, the device 1 in accordance with the invention exhibits a peak at about 2.4 eV which is much stronger than that of CN-PPV alone at that energy and much broader than that of MEH-PPV alone at that energy. Therefore, a device in accordance with the invention should be much more sensitive to light in this particular energy or wavelength range than the devices which have a photoresponsive layer formed simply of either MEH-PPV or CN-PPV alone.

Figure 7:
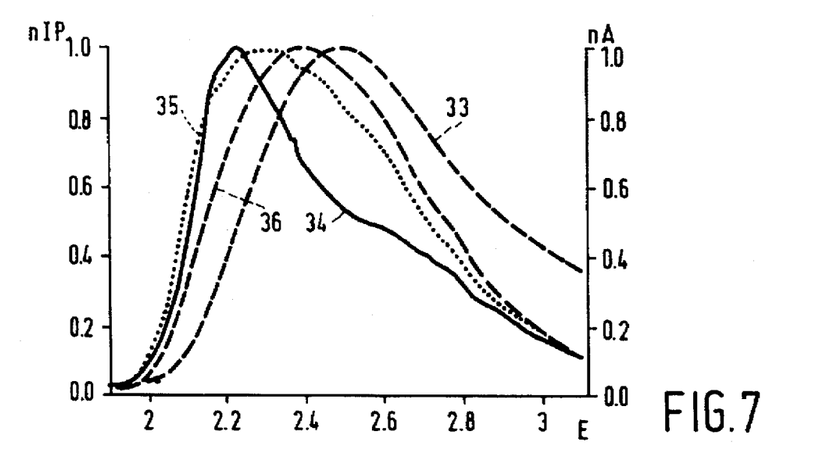
FIG. 7 illustrates graphically the normalized short-circuit photocurrent nIP against energy E in electron volts (eV) of three photoresponsive devices in accordance with the invention having different thickness photoresponsive zones.

FIG. 7 shows the normalized short-circuit photocurrent nIP against photon energy E in eV for three devices in accordance with the invention which differ in the thickness of the MEH-PPV/CN-PPV polymer blend layer 2. The solid line 34 shows the spectral response for a device 1 having a photoresponsive layer 2 300 nm thick, the dotted line 35 shows the spectral response for a device 1 having a layer 2 of 250 nm thickness while the dashed line 36 shows the spectral response for a device having a layer 2 with a thickness of 150 nm. The long dashed line 33 is again the normalized absorbance. As can be seen from FIG. 7, the peak of the spectral response of a device in accordance with the invention broadens with reduction in the thickness of the layer 2 and the actual peak is slightly blue-shifted, that is shifted to lower energy.

Figure 8:
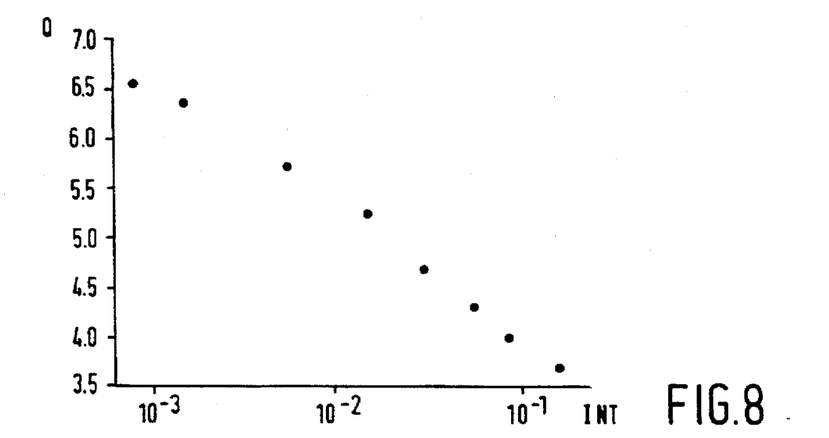
FIG. 8 illustrates graphically the quantum yield Q of a photoresponsive device in accordance with the invention as a function of intensity INT in mWcm$^{-2}$ where light of a wavelength of 544 nanometers (nm) is incident on the device.

The quantum yield, that is the number of electronic charges collected at the electrodes for each incident quantum of light, as a percentage and a function of the light intensity from a laser monochromatic light source at 544 nm calculated from the above-discussed short-circuit photocurrent nIP at 544 nm (the average peak position) extracted from spectral response data acquired at different intensities and silicon photodiode calibration data is illustrated in FIG. 8. As can be seen from FIG. 8, the quantum yield Q increases from a minimum of 3.75% at an intensity of 0.16 mW cm$^{-2}$ to over 6.5% at 0.8 $\mu$ W cm$^{-2}$ (microWatts cm$^{-2}$).

Figure 9:
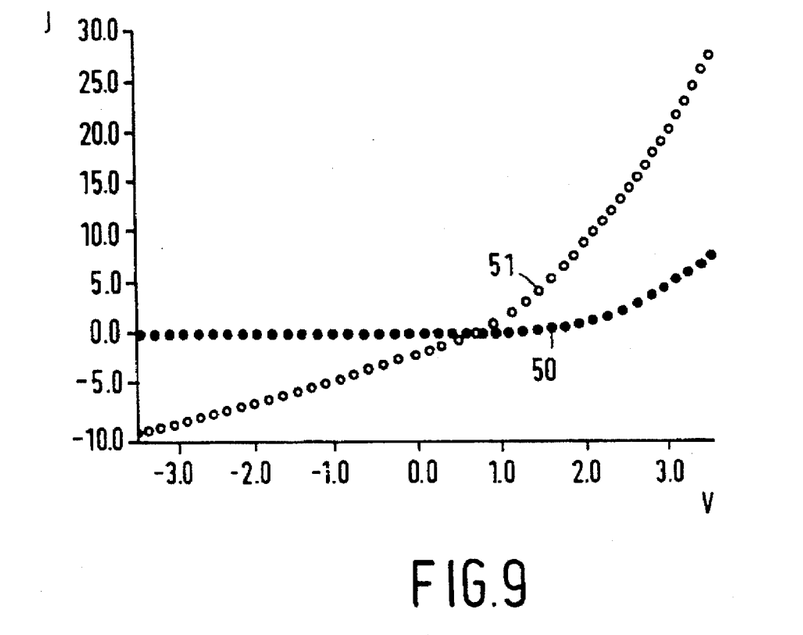
FIG. 9 illustrates graphically the current density J against voltage V for a device in accordance with the invention in the dark and under illumination.

FIG. 9 shows the current density (J)-voltage (V) characteristics of a device in accordance with the invention having a MEH-PPV/CN-PPV polymer blend layer 2. The line 50 shows the situation in the dark and the line 51 under illumination at a wavelength of 550 nm and an intensity of 0.15 mW cm$^{-2}$. Without illumination, as illustrated by curve 50, a device in accordance with the invention exhibits a rectification ratio of 10$^3$. With illumination and under reverse or forward bias the photocurrent increases in magnitude and the quantum yield increases accordingly as shown by the line 5.

As shown in FIG. 9, the quantum yield increases from, in this case, 2.9% under short-circuit conditions, to 15% at a reverse bias (that is with the ITO electrode 3 biassed negative with respect to the aluminum electrode 4) of −3.5 V, and 31% at a forward bias of the same magnitude, for illumination at 550 nm at an intensity of 0.15 mWcm$^{-2}$.

The current voltage characteristics of this device 1 in the dark exhibit rectifying characteristics in a similar fashion to PPV diodes. The intrinsic conductivity of the layer 2 is very low, and the dark current is mediated by charge injected by the contacts. Under reverse bias charge injection is unfavorable, and the current is very small. In forward bias, above the open circuit voltage, injection becomes favorable. Since the work function of the ITO electrode 3 is greater than that of the LUMO (Lowest Unoccupied Molecular Orbital) of the MEH-PPV, and that of the aluminum electrode 4 is below that of the CN-PPV, electrons and holes must tunnel through potential barriers to enter the device. As the forward bias is increased, the bands become steeper, and the tunnelling distance becomes smaller. Thus the current increases.

The photocurrent is not a simple additive component to this dark current. The curve 51 obtained under illumination cross the dark curve 50. This may be because the device resistance at these biases is determined largely by the bulk resistance of the polymer blend film or layer 2. Although the dark conductivity of the layer 2 is low, it increases with illumination, and so at a given current the voltage developed across the layer 2 falls as the intensity increases. The processes of injection may also be illumination dependent.

Under large reverse biases as in, for example, operation in a photodetector mode, the internal field in the device will increase, and charges will be swept out of the layer 2 to the electrodes 3 and 4 and will be less susceptible to trapping and recombination. The driving force for exciton separation may also increase. This may explain the increase in quantum yield observed under reverse biases. A similar argument applies to measurements under forward bias, except in this case electrons exit via the ITO electrode 3 and so electrons generated close to the ITO electrode 3 have an enhanced escape probability and the quantum yield is increased accordingly compared with the reverse bias values.

Figure 10:
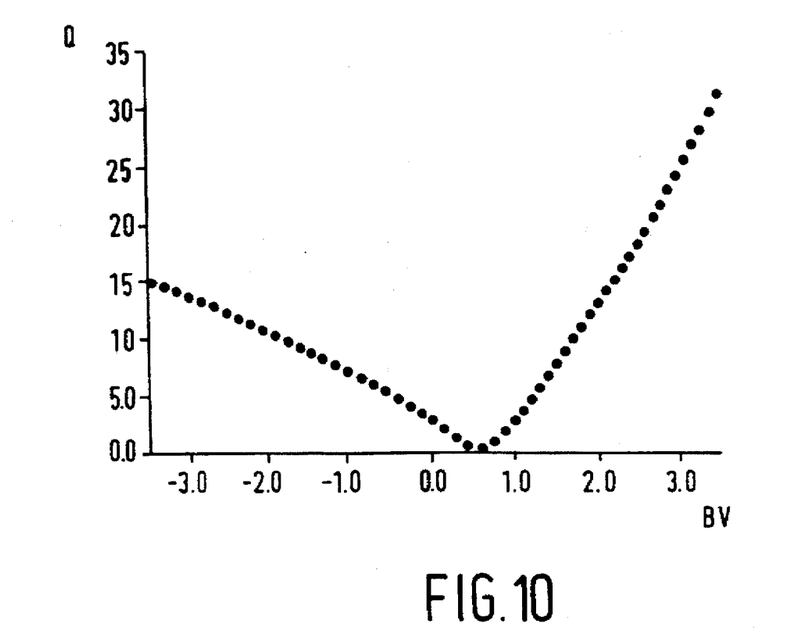
FIG. 10 illustrates graphically the quantum yield Q of a device in accordance with the invention against bias voltage where the device is exposed to light of a wavelength of 550 nanometers and with an intensity of 0.15 milliWatt cm$^{-2}$.

FIG. 10 shows the quantum yield Q calculated as a function of bias voltage BV with the dark current subtracted from the curve 51 in FIG. 9.

In addition to the above, measurements made of the photoluminescence efficiency of MEH-PPV, CN-PPV and a blend of these two polymers show that the blend has a much lower photoluminescence efficiency than the separate polymers so supporting the view that there is efficient charge transfer between the first and second semiconductive polymers in the blend which prevents or at least inhibits re-emission of photons (light) from excitons created by photon absorption. As can be seen from the above, a device in accordance with the invention and having a MEH-PPV/ CN-PPV polymer blend layer 2 exhibits a quantum yield of 6.5% under short-circuit conditions and intensities of the order of 1$\mu$ W cm$^{-2}$, Furthermore, considerable photocurrent magnification under forward and reverse biases is also observed. It is believed that the improved quantum yield over devices having a photoresponsive layer consisting solely of MEH-PPV or CN-PPV arises from charge-transfer initiated exciton dissociation in the bulk of the polymer film, primarily due to the energetically favored separation of electrons and holes between the second and first semiconductive polymers.

Thus, a device in accordance with the invention allows relatively high quantum yields to be obtained at low light intensities and in addition provides a broad spectral response curve resulting from improved exciton dissociation through charge transfer in the bulk of the polymer blend.

Photoresponsive devices in accordance with the invention may be used in any circumstance where a conventional photoresponsive device such as an amorphous silicon pin diode may used and may be provide particular advantages where there is a need for a very large photoresponsive surface area for example as in the case of solar cell. For example, where the substrate is flexible, then the device itself, or an array of devices, may also be flexible and thus be suitable for application to non-planar surfaces and, moreover, manufacture of the device may be by continuous processing from roll to roll of flexible substrate.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention.

We claim:

1. A photoresponsive device comprising a photoresponsive zone having first and second major surfaces and first and second electrodes provided on respective ones of the first and second major surfaces of the photoresponsive zone, the photoresponsive zone comprising a polymer blend having regions of a first semiconductive polymer and regions of a second semiconductive polymer phase-separated from the first semiconductive polymer, the second semiconductive polymer having an electron affinity greater than that of the first semiconductive polymer so that, in use of the device, a photocurrent between the first and second electrodes resulting from light incident on the photoresponsive zone comprises electrons travelling predominantly through the second semiconductive polymer and holes travelling predominantly through the first semiconductive polymer.

2. A photoresponsive device according to claim 1, wherein the regions of the first and second semiconductive polymers form interpenetrating networks which define a path through the first and second semiconductive polymers for travel of a charge carrier between the first and second electrodes.

3. A photoresponsive device as claimed in claim 2, wherein at least one of the first and second semiconductive polymers comprises a conjugated polymer chain.

4. A photoresponsive device as claimed in claim 2, wherein at least one of the first and second semiconductive polymers comprises a polymer chain having conjugated sections separated by non-conjugated sections of the chain.

5. A photoresponsive device as claimed in claim 2 wherein at least one of the first and second semiconductive polymers comprises a substantially non-conjugated polymer chain carrying conjugated side groups.

6. A photoresponsive device as claimed in claim 2 wherein the first and second semiconductive polymers comprise derivatives of PPV each having at least one substituent.

7. A photoresponsive device as claimed in claim 2 wherein the first and second semiconductive polymers comprise poly(phenylene)s or poly(thienylene)s.

8. A photoresponsive device as claimed in claim 2 wherein at least one of the first and second electrodes is light-transmissive.

9. A photoresponsive device according to claim 2 wherein one of the first and second electrodes comprises indium oxide or indium tin oxide and the other of the first and second electrodes comprises aluminum, magnesium or calcium.

10. A photoresponsive device according to claim 1, wherein at least one of the first and second semiconductive polymers comprises a conjugated polymer chain.

11. A photoresponsive device as claimed in claim 10, wherein at least one of the first and second semiconductive polymers comprises a polymer chain having conjugated sections separated by non-conjugated sections of the chain.

12. A photoresponsive device as claimed in claim 10 wherein at least one of the first and second semiconductive polymers comprises a substantially non-conjugated polymer chain carrying conjugated side groups.

13. A photoresponsive device as claimed in claim 10 wherein at least one of the first and second electrodes is light-transmissive.

14. A photoresponsive device according to claim 10 wherein one of the first and second electrodes comprises indium oxide or indium tin oxide and the other of the first and second electrodes comprises aluminum, magnesium or calcium.

15. A photoresponsive device according to claim 1, wherein at least one of the first and second semiconductive polymers comprises a polymer chain having conjugated sections separated by non-conjugated sections of the chain.

16. A photoresponsive device as claimed in claim 15 wherein at least one of the first and second semiconductive polymers comprises a substantially non-conjugated polymer chain carrying conjugated side groups.

17. A photoresponsive device as claimed in claim 15 wherein at least one of the first and second electrodes is light-transmissive.

18. A photoresponsive device according to claim 15 wherein one of the first and second electrodes comprises indium oxide or indium tin oxide and the other of the first and second electrodes comprises aluminum, magnesium or calcium.

19. A photoresponsive device according to claim 1, wherein at least one of the first and second semiconductive polymers comprises a substantially non-conjugated polymer chain carrying conjugated side groups.

20. A photoresponsive device as claimed in claim 19 wherein at least one of the first and second electrodes is light-transmissive.

21. A photoresponsive device according to claim 19 wherein one of the first and second electrodes comprises indium oxide or indium tin oxide and the other of the first and second electrodes comprises aluminum, magnesium or calcium.

22. A photoresponsive device according to claim 1, wherein the first and second semiconductive polymers each have one or more substituents.

23. A photoresponsive device as claimed in claim 22 wherein at least one of the first and second electrodes is light-transmissive.

24. A photoresponsive device according to claim 22 wherein one of the first and second electrodes comprises indium oxide or indium tin oxide and the other of the first and second electrodes comprises aluminum, magnesium or calcium.

25. A photoresponsive device according to claim 1, wherein the first and second semiconductor polymers comprise derivatives of poly (p-Phenyl vinylene), (PPV), each having at least one substituent.

26. A photoresponsive device according to claim 25, wherein the at least one substituent of the first semiconductive polymer is selected from the group consisting of alkyl, alkoxy, halogen, thiol and nitro components.

27. A photoresponsive device as claimed in claim 26, wherein the at least one substituent of the second semiconductive polymer is selected from the group consisting of cyano, nitrile, trifluoromethyl and ester groups.

28. A photoresponsive device as claimed in claim 26 wherein the second semiconductive polymer comprises a cyano-substituted copolymer of PPV with one or more alkyl side groups.

29. A photoresponsive device as claimed in claim 26 wherein at least one of the first and second electrodes is light-transmissive.

30. A photoresponsive device according to claim 26 wherein one of the first and second electrodes comprises indium oxide or indium tin oxide and the other of the first and second electrodes comprises aluminum, magnesium or calcium.

31. A photoresponsive device according to claim 25, wherein the at least one substituent of the first semiconductive polymer is selected from the group consisting of methyl, methoxy, ethoxy, chlorine, bromine and nitro groups.

32. A photoresponsive device as claimed in claim 31, wherein the at least one substituent of the second semiconductive polymer is selected from the group consisting of cyano, nitrile, trifluoromethyl and ester groups.

33. A photoresponsive device as claimed in claim 31 wherein the second semiconductive polymer comprises a cyano-substituted copolymer of PPV with one or more alkyl side groups.

34. A photoresponsive device as claimed in claim 31 wherein at least one of the first and second electrodes is light-transmissive.

35. A photoresponsive device according to claim 31 wherein one of the first and second electrodes comprises indium oxide or indium tin oxide and the other of the first and second electrodes comprises aluminum, magnesium or calcium.

36. A photoresponsive device according to claim 25, wherein the first semiconductor polymer comprises poly(2-methoxy, 5-(2'-ethyl) hexyloxy-p-phenylene vinylene)), (MEH-PPV).

37. A photoresponsive device as claimed in claim 36, wherein the at least one substituent of the second semiconductive polymer is selected from the group consisting of cyano, nitrile, trifluoromethyl and ester groups.

38. A photoresponsive device as claimed in claim 36 wherein the second semiconductive polymer comprises a cyano-substituted copolymer of PPV with one or more alkyl side groups.

39. A photoresponsive device as claimed in claim 36 wherein at least one of the first and second electrodes is light-transmissive.

40. A photoresponsive device according to claim 36 wherein one of the first and second electrodes comprises indium oxide or indium tin oxide and the other of the first and second electrodes comprises aluminum, magnesium or calcium.

41. A photoresponsive device according to claim 25 wherein the at least one substituent of the second semiconductive polymer is selected from the group consisting of cyano, nitrile, trifluoromethyl and ester groups.

42. A photoresponsive device as claimed in claim 41 wherein the second semiconductive polymer comprises a cyano-substituted copolymer of PPV with one or more alkyl side groups.

43. A photoresponsive device as claimed in claim 41 wherein at least one of the first and second electrodes is light-transmissive.

44. A photoresponsive device according to claim 41 wherein one of the first and second electrodes comprises indium oxide or indium tin oxide and the other of the first and second electrodes comprises aluminum, magnesium or calcium.

45. A photoresponsive device according to claim 25 wherein the second semiconductive polymer comprises a cyano-substituted copolymer of PPV with one or more alkyl side groups.

46. A photoresponsive device as claimed in claim 45 wherein at least one of the first and second electrodes is light-transmissive.

47. A photoresponsive device according to claim 45 wherein one of the first and second electrodes comprises indium oxide or indium tin oxide and the other of the first and second electrodes comprises aluminum, magnesium or calcium.

48. A photoresponsive device as claimed in claim 25 wherein at least one of the first and second electrodes is light-transmissive.

49. A photoresponsive device according to claim 25 wherein one of the first and second electrodes comprises indium oxide or indium tin oxide and the other of the first and second electrodes comprises aluminum, magnesium or calcium.

50. A photoresponsive device according to claim 1, wherein the first and second semiconductive polymers comprise poly(phenylene)s or poly(thienylene)s.

51. A photoresponsive device according to claim 50, wherein the first semiconductor polymer comprises a poly (3-alkyl thienylene) or a poly (3,3' alkyl thienylene) with the alkyl group comprising an alkyl group having at least 4 carbon atoms and the second semiconductor polymer comprises a polymer similar to the first semiconductor polymer but with the addition of at least one electron-withdrawing group.

52. A photoresponsive device as claimed in claim 51 wherein at least one of the first and second electrodes is light-transmissive.

53. A photoresponsive device according to claim 51 wherein one of the first and second electrodes comprises indium oxide or indium tin oxide and the other of the first and second electrodes comprises aluminum, magnesium or calcium.

54. A photoresponsive device as claimed in claim 50 wherein at least one of the first and second electrodes is light-transmissive.

55. A photoresponsive device according to claim 50 wherein one of the first and second electrodes comprises indium oxide or indium tin oxide and the other of the first and second electrodes comprises aluminum, magnesium or calcium.

56. A photoresponsive device according to claim 1, wherein at least one of the first and second electrodes is light-transmissive.

57. A photoresponsive device according to claim 56 wherein one of the first and second electrodes comprises indium oxide or indium tin oxide and the other of the first and second electrodes comprises aluminum, magnesium or calcium.

58. A photoresponsive device according to any claim 1, wherein one of the first and second electrodes comprises indium oxide or indium tin oxide and the other of the first and second electrodes comprises aluminum, magnesium or calcium.

59. A photoresponsive semiconductor comprising a polymer blend having regions of a first semiconductive polymer and regions of a second semiconductive polymer phase-separated from the first semiconductive polymer and having an electron affinity greater than that of the first semiconductive polymer, so facilitating charge separation between the first and second semiconductive polymers.

60. A photoresponsive semiconductor comprising a phase-separated polymer blend having regions of a first semiconductive polymer comprising poly(p-phenylene vinylene), (PPV), having at least one substituent selected from the group consisting of alkyl, alkoxy, halogen and nitro components and regions of a second semiconductive polymer comprising a cyano-substituted copolymer of PPV having an electron affinity greater than that of the first semiconductive polymer, so facilitating charge separation between the first and second semiconductive polymers.

61. A photoresponsive semiconductor according to claim 60, wherein the first semiconductive polymer comprises poly(2-methoxy, 5-(2'-ethyl)hexyloxy-p-phenyl vinylene)), (MEH-PPV), and the second semiconductive polymer comprises a cyano-substituted copolymer of PPV with one or more alkyl side groups.

62. A photoresponsive semiconductor according to claim 18, wherein the first semiconductor polymer has the structural formula and the second semiconductive polymer has the structural formula wherein n is an integer greater than 1 and $R=C_6H_{13}$.